(12) United States Patent
Hedberg (10) Patent No.: US 6,281,740 B1
(45) Date of Patent: Aug. 28, 2001

(54) CONNECTING ARRANGEMENT FOR SELECTIVELY PRESENTING RESISTIVE PROPERTIES USING TRANSISTORS

(75) Inventor: Mats Olof Joakim Hedberg, Haninge (SE)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 08/404,920

(22) Filed: Mar. 16, 1995

(30) Foreign Application Priority Data

Mar. 23, 1994 (SE) .................................................. 94 00970

(51) Int. Cl.[7] .................................................. H02J 3/38
(52) U.S. Cl. .............................. 327/530; 327/334; 326/30
(58) Field of Search .................................... 327/334, 512, 327/513, 530; 326/30; 333/32, 33, 81 R (56) References Cited

U.S. PATENT DOCUMENTS

| | | | |
|---|---|---|---|
| 3,715,609 | * | 2/1973 | Hallen .................................. 327/513 |
| 4,013,975 | * | 3/1977 | Kataoka et al. ...................... 327/328 |
| 4,016,481 | * | 4/1977 | Bradley ................................ 327/316 |
| 4,395,643 | * | 7/1983 | Lehmann ............................. 327/308 |
| 4,568,840 | * | 2/1986 | Kenji ................................... 327/574 |
| 4,710,726 | * | 12/1987 | Czarnul .................................. 330/69 |
| 4,875,023 | * | 10/1989 | Maoz ................................. 333/81 R |
| 5,010,385 | * | 4/1991 | Shoemaker ............................ 357/41 |
| 5,134,311 | * | 7/1992 | Biber et al. .......................... 327/108 |

OTHER PUBLICATIONS

"A Self–Terminating Low–Voltage Swing CMOS Output Driver", Thomas F. Knight, Jr. et al., IEEE Journal of Solid State Circuits, vol. 23, No. 2 Apr. 1988, pp. 457–464.

* cited by examiner

Primary Examiner—Kenneth B. Wells
(74) Attorney, Agent, or Firm—Burns, Doane, Swecker & Mathis L.L.P.

(57) ABSTRACT

A connecting arrangement includes a number of NMOS transistors that can be activated or deactivated by means of a control voltage, serving as a control signal, connected to the gate terminals of transistors, to be able to form a circuit connected between two conductors, the circuit presenting resistive properties. The circuit is equipped with a signal receiver and it is regulated by an analog control voltage. The control voltage is connectable to one or several of a number of available control connections. Each control connection is connected to the gate terminals of a group of transistors where the drain and source terminals are connected to the conductors. The control voltage is selected so that the operating point of the transistors will be within, or at least close to, the region where the transistor presents resistive properties.

18 Claims, 5 Drawing Sheets

CONNECTING ARRANGEMENT FOR SELECTIVELY PRESENTING RESISTIVE PROPERTIES USING TRANSISTORS

BACKGROUND

The invention relates generally to a connecting arrangement and more specifically to such a connecting arrangement that comprises a number of transistors that can be activated and deactivated by a control signal connected to the control terminals of the transistors to form, by means of the control signal, a circuit between two conductors with resistive properties and values.

More specifically, this circuit presents a resistance value that corresponds to the value of the control signal, such as a voltage value, by which a set resistance value can be changed in dependence on a selected other voltage value with an increasing resistance value corresponding to an increasing voltage value.

When the expression "resistive properties" is used in the following description and claims it will be understood that this expression refers to not only purely resistive properties but also substantially resistive properties. It will further be understood that when the expression "transistor" is used it refers, not only to a single transistor, but also to one or several transistors connected in parallel or series, or any other configuration of transistors, which present functions and/or properties that are similar to a single transistor.

The present invention is, more specifically, meant to be used as a terminating impedance with resistive properties belonging to a signal receiving circuit, adapted to receive voltage pulses that appear on one or two conductors intended to transfer signals. The bit-rate of the voltage pulses can exceed 150 megabits per second (150 Mb/s).

It is previously known, and it is within the characteristics of transistors manufactured with CMOS technology, such as NMOS transistors, that the drain-source section of these transistors presents resistive properties, or substantially resistive properties, within an initial voltage range of the drain-source voltage ($V_{DS}$) for various values of the gate-source voltage ($V_{GS}$), and it is thereby known to use this property in various circuit connections.

It is thus previously known to use one or several transistors to form a circuit connected between two conductors and presenting resistive properties and values, where the current resistance value depends on the selected voltage value of a control signal connectable to the gate terminal(s) of the transistor(s).

It is further known that signal receiving circuits are equipped with matching impedances, with resistive properties, to adapt the signalling across the signalling conductors, wherein the resistance value of the matching impedance is adjustable to present a momentary resistance value that corresponds to the momentary impedance conditions of the signal transmission. It is previously known, through U.S. Pat. No. 5,194,765, to control the matching impedance of a transmitter digitally, with a control circuit intended for this purpose. A paper by Knight et al., "A Self-Terminating Low-Voltage-Swing CMOS Output Driver" IEEE Journal of Solid State Circuits, vol. 23, pp. 457–464 (Apr. 1988) describes a CMOS circuit intended to generate a digital signal at an output terminal that has a specific and controlled output impedance. The circuit arrangements described here are thus digitized and transmitter related.

In view of the known prior art, as described above, there is a need for a circuit equipped with a signal receiver that can be regulated by an analog control voltage, where the resistive properties of the circuit can be varied within certain limits by connecting one or several analog control signals to one or several control terminals of one or several transistors. Each and every one of these control signals should be connected to the gate terminals of a group of transistors where the drain terminals and source terminals of the transistors are connected to two receiver-related signalling conductors. At the same time, the control signal, in the form of a control voltage, is selected so that the operating point of a transistor will be within, or at least close to, the region where the transistor presents resistive properties. A first control connection, intended for a first control signal, should coact with a first group of transistors, and a second control connection, intended for a second control signal, should coact with a second group of transistors, and so on, in order to provide various combinations that will enlarge the available region of resistive values. The number of transistors within a first group should be selected to be different from the number of transistors within a second group in order to further enlarge the available region of resistive values.

There is further a need for a connecting arrangement presenting resistive properties of the above-described kind as receiver-related terminating resistances, within a system intended to transfer information-carrying signals with digital voltage pulses and high frequency and with the selected transistors preferably NMOS transistors.

There is a need to realize the advantages obtained with a connecting arrangement of the above-described kind, when the circuit, connected between the two conductors, is intended to serve as a terminating impedance with substantially resistive properties either connected between the signalling conductors and a reference potential (VT) or between the conductors.

There is, besides this, a need to realize the advantages obtained by using a gate matrix and a macro circuit along the edges of the gate matrix from a base-bar of the gate matrix to the terminating circuit.

There is further a need to realize the advantages obtained by letting the second of the two conductors be a conductor that presents a voltage reference, such as a conductor connected to ground potential.

There is also a need to form, from a base-bar, with a thereto applied metal layer, a circuit that is connectable as a receiver-related terminating impedance, with resistive properties, within a signal receiving unit, that can be used in "single-ended" signalling and form active parallel terminating impedances within a signal receiving unit adapted to "differential" signalling. A control signal, or control signals, should be controlled through specific connecting means. The connecting means should be controlled to generate a digital signal for set resistance values and/or an analog signal to select any resistance value within the available resistance range. The connecting means should be a number of analog transmission gates, each and every one controllable into an active or inactive state. The analog transmission gates should be activated or deactivated by means of a signal inverting circuit.

An analog transmission gate should be coordinated to a control connection of a group of transistors, such as NMOS transistors. A control voltage, passing through respective analog transmission gates, should be given digitized voltage values or analog voltage values. Certain group-related transistors, such as NMOS transistors, should be selected for digitized voltage values, and certain other group-related transistors should be selected for analog voltage values in order to create selected impedance or resistance values. A control connection should be given a voltage value corresponding to a selected terminating reference and regulated by a specifically constructed regulating circuit. The selected transistors, and/or transistor connections, should present a large region with resistive properties and thereby a large regulating area. The voltage between the drain and source terminals should be selected up to, or somewhat below, 1.5 V. A connection of various selected resistance values, with resistance variations weighted in a unanimous way according to a digital series, should be performed by means of a connection of one or several selected groups of transistors. An analog control voltage should be selected in order to control continuously the resistance variations to a selected value.

SUMMARY

With the intention of providing one or more of the above-stated needs, the invention provides a connecting arrangement comprising a number of transistors that can be activated and deactivated by a control voltage, serving as a control signal, connected to the control terminals of the transistors. In this way, a circuit connected between two conductors is formed, where the circuit presents resistive properties and values that can be regulated by, in each case, an analog control voltage.

The circuit can be adapted to be used as a terminating impedance, having resistive properties, and preferably related to a signal receiver and/or a signal transmitter or any other device requiring a matching impedance.

According to one aspect of the invention, with such a connecting arrangement, the analog control signal, in the form of a control voltage, is connectable to one or several of a number of available control signal lines. Each control signal line is connected to the control terminals of a group of transistors where the other terminals of the transistors are connected to the conductors, and the control voltage is selected so that the operating point of the transistors will be within, or at least close to, the region where the transistor presents resistive properties. In one embodiment of the invention, the control terminal is the gate terminal and the other terminals are to be the drain terminal and the source terminal of a CMOS transistor.

The control voltage is normally selected to be high within the active region of the transistor and the voltage across the drain and source terminals is selected to be low within the active region of the transistor.

A first control signal line coacts with a first group of transistors, and a second control signal line coacts with a second group of transistors, and so on. The number of transistors within the first group is selected to be different from the number of transistors within another group. The number and dimensioning of the transistors, such as NMOS transistors, within available groups is selected between the groups so that a connection of one or several selected groups will be able to provide various resistance values, preferably with a resistance variation weighted in a unanimous way according to a digital series, which in combination with the analog control voltage will permit resistance values to be selected from a continuous resistance variation.

One of the conductors may constitute a signalling conductor for transferring digital information-carrying voltage pulses, while the other of the two conductors may constitute a conductor that presents a voltage reference, such as a ground reference.

The circuit is connectable as the terminating impedance, with resistive or substantially resistive properties, of a signal receiving unit adapted to "single-ended" signalling, or as the terminating impedance of a signal receiving unit adapted to "differential" signalling.

The control signal or control signals, appearing on one or several control signal lines, is/are controlled through connecting means that are pre-connected to the circuit. Such connecting means can preferably be a number of analog transmission gates that preferably can be activated and deactivated by a control circuit, such as a signal inverting circuit. One analog transmission gate is coordinated to the respective control signal lines of a group of transistors. The control voltages of a number of selected analog transmission gates can be given digitized voltage values or, alternatively, analog voltage values.

A control signal line can be given an analog voltage value from a regulating circuit for generating a regulated control voltage corresponding to a terminating reference.

The size of the transistor is selected in a way that presents a large region with resistive properties and so that the voltage across the drain and source terminals is selected up to or below 1.5 V.

The advantages primarily afforded by a connecting arrangement and a circuit presenting resistive properties and values according to the present invention are that it is possible to select, as a matching impedance in a signal receiving and/or a signal transmitting unit, a momentary resistance value for the circuit depending on an analog control signal, preferably in the form of a control voltage.

It has further been found that a circuit of this kind advantageously can be connected as the terminating impedance, with resistive properties, of a signal receiving unit, where the circuit can be integrated within a gate matrix and that the circuit can be acquired and structured through a configuration of the metal-layer positioned on a base-bar and constituting a macro-surface along the edges of the gate matrix.

The control signal and its connection to one or several control signal lines is performed through connecting means comprising a number of analog transmission gates, the transmission gates also being formed through the configuration of a metal-layer on a base-bar.

BRIEF DESCRIPTION OF THE DRAWINGS

An exemplifying embodiment of a connecting arrangement with a circuit presenting resistive properties and values, and an application thereof in a signal receiving circuit intended for information carrying signals, will now be described in more detail with reference to the accompanying drawings, in which.

DETAILED DESCRIPTION

Figures 1, 2:
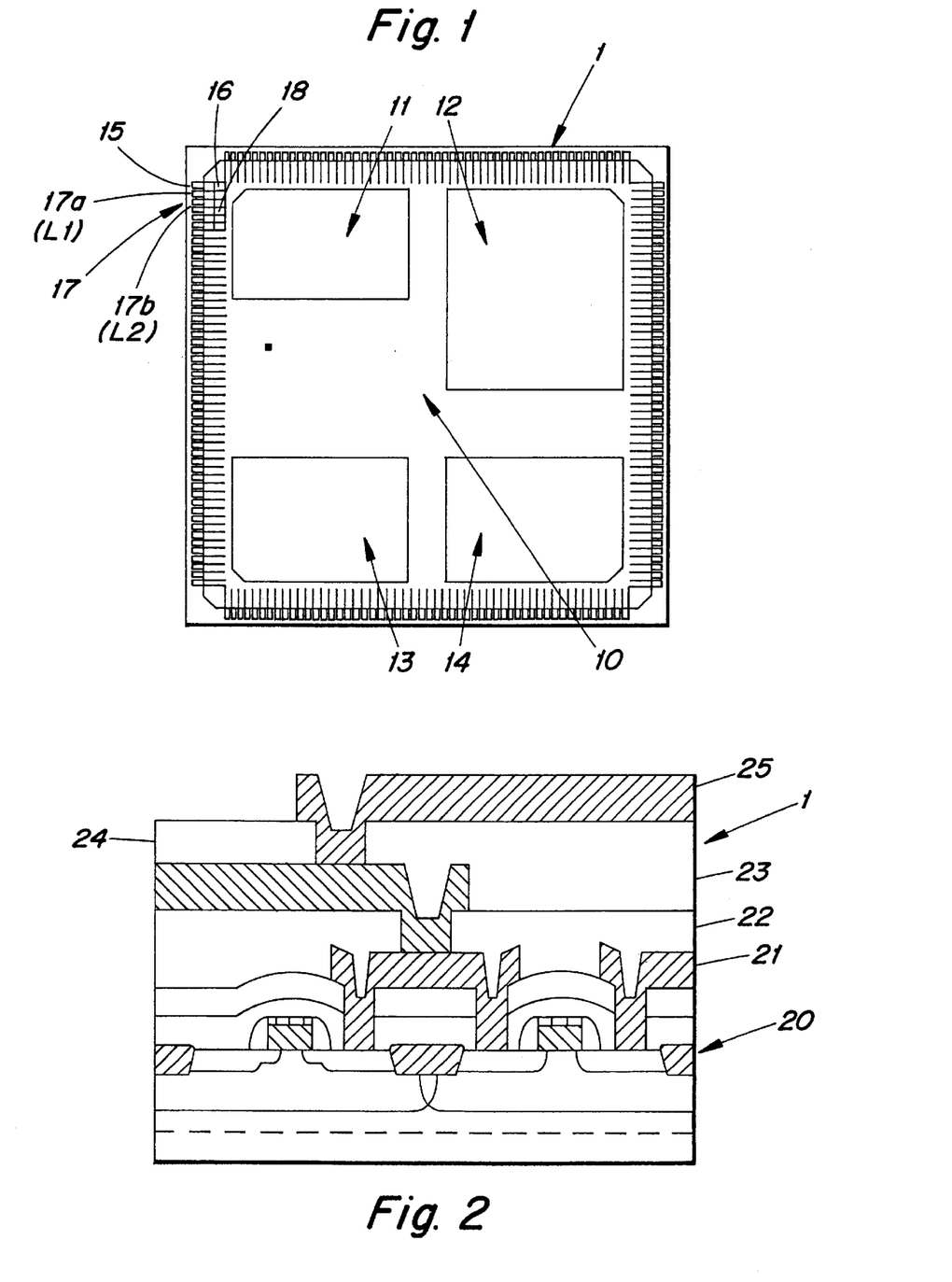
FIG. 1 illustrates, in horizontal view, a gate matrix that the present connecting arrangement advantageously can be built into.
FIG. 2 illustrates a cross section through the gate matrix, according to FIG. 1, to illustrate the principal construction of a gate matrix of this kind, with a base-bar and an overlying metal layer.

With reference to FIG. 1 a plane view of a gate matrix 1, or an integrated circuit, is illustrated. This circuit comprises a base-bar 20 and thereto applied metal layers, intended to form required connecting conductors between the NMOS and PMOS transistors, resistances, etc., formed within the base-bar. The base-bar 20 is formed so that during the manufacturing process a gate sea 10 is formed at a central position with respect to the edges of the gate matrix 1.

Other functional units 11, 12, 13, 14, such as memory units, calculating circuits, processors and likewise, can also be positioned within or around the gate 10, but these parts are not further described since they are not an essential part of the present invention.

Figures 3, 4:
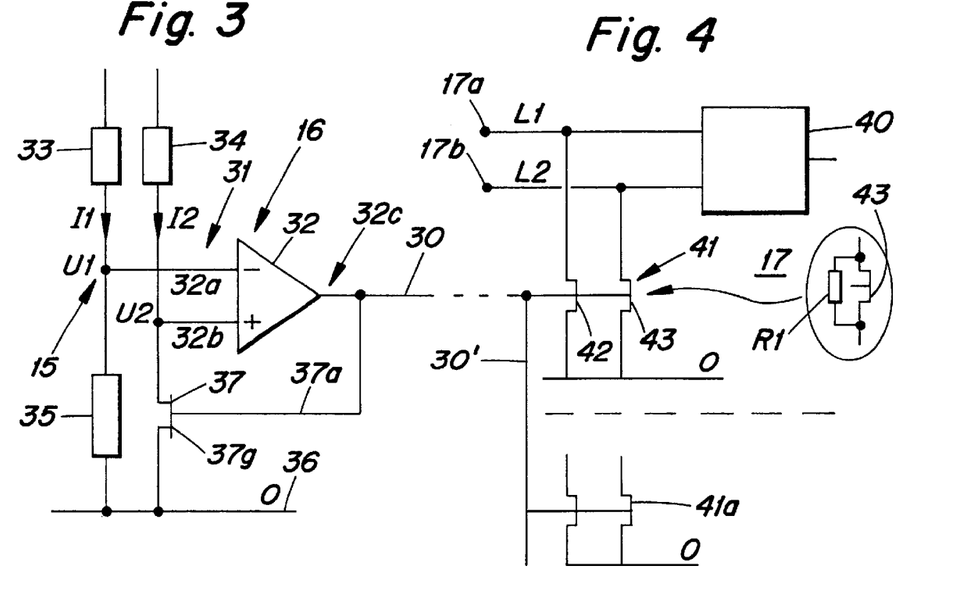
FIG. 3 illustrates a principal wire diagram of a circuit that generates a control voltage.
FIG. 4 illustrates in a simplified wiring diagram one of several available signal receiving circuits where the terminating load or matching impedance of the circuit is to be regulated and adapted according to the present invention.

A gate matrix 1, according to the embodiment illustrated in FIG. 1, is equipped with a large number of connecting surfaces or pads (bond-pads) along the edges, where one of these, given a position at the top left edge, has been numbered 15. This bond-pad 15 is a part of a macro circuit 16. The circuit 16 is a control voltage generating circuit made out of NMOS transistors and/or likewise, which is illustrated in FIG. 3. The circuit 16 only has one connecting surface for an external connection, which is the bond-pad 15, and this is intended to connect to a selected reference resistance. The reference resistance is connected with one connection to the bond-pad 15, and the other connection is connected to a circuit external ground potential or likewise (not illustrated).

Next to the circuit 16 there are one or several I/O circuits, where a first of these has been given the number 17. Each and every one of the I/O circuits 17 can have one or two bond-pads 17a, 17b for a signal receiving circuit and for a signal transmitting circuit, intended to connect external conductors (L1, L2). The I/O circuit 17 presents two external bond-pads 17a, 17b intended to coact with one conductor each (L1, L2) for the information-carrying signals and a "differential" signal transmission.

Each and every such I/O circuit can be equipped with required bond-pads (17a, 17b) for incoming information-carrying signals and required bond-pads for outgoing information-carrying signals. These bond-pads will not be described in more detail since the number of, and the positions of, these bond-pads, and the distribution of the bond-pads, is not a part of the present invention. The basis of the invention is that an input-circuit, a signal receiving circuit, is to be provided with various selected resistance values as terminating impedances.

In the surface area 18 adjacent to the circuit 17, additional components can be connected to the gate matrix 1, such as a terminating impedance or connecting means for transferring control signals. The terminating impedance and the connecting means are described in further detail below with reference to FIGS. 5 and 6, respectively.

FIG. 2 illustrates a cross section of a gate matrix 1 comprising a base-bar 20 where, in a known way, a number of NMOS transistors, PMOS transistors, and other connecting elements required in a "standardized" or custom-designed gate matrix are formed. On top of the base-bar 20 there is a first metal layer 21 and a first isolating layer 22, a second metal layer 23 and a second isolating layer 24, and yet a third metal layer 25. The metal layer 21 is mainly intended to form the required connecting conductors between the used PMOS and/or NMOS transistors in the base-bar 20 in order to create a predetermined connection of these transistors. The isolating layer 22 is intended to separate these conductors from the second metal layer 23 that mainly is intended to supply power to selected points of metal layer 21.

The NMOS and PMOS transistors and required connecting conductors used by the circuit 16, intended among other things for used as a differential operational amplifier, are thus supplied by the base-bar 20 of the gate matrix 1 and the mechanical and electrical connections are mainly done through the metal layer 21 but also through the metal layer 23. With this background the present invention will now be described.

The indicated circuit 16, according to FIG. 3, is thus intended both to provide a resistance value, serving as a reference, made out of a parallel connection of an external reference resistance 35, connected between a bond-pad 15 and ground potential, and an internal adjustable resistance 37, and to provide an adjustable control voltage, or insignificantly variable control voltage, that is to control the momentary resistance value of an input impedance or input resistance belonging to a signal receiving circuit 40 within a signal receiving unit in the I/O circuit 17.

The control voltage is thus adjustable to provide the resistive component of the input impedance with a value that is appropriate for signal matching. The control voltage can thereby be considered as constant over short periods of time and variable over longer periods of time to be able to compensate for slow trends, such as temperature variations. Minor variations of the control voltade insignificantly influence variations of the resistance value of the matching circuit that presents resistive properties and belongs to the signal receiving circuit.

A circuit 31 for generating a control voltage on conductor 30 comprises, according to FIG. 3, a differential operational amplifier 32 having two input terminals 32a, 32b and one output terminal 32c. The circuit 31 comprises also two current circuits 33, 34 (which can be resistances) serving as current generators, where one of these circuits 33 conducts a current through a resistance 35, and preferably the circuit is externally connected and serves as a reference, to ground potential 36. The voltage "U1" that appears across the resistance 35 is connected to one input 32a of the two input terminals of the operational amplifier 32.

The other circuit 34 of the two current circuits conducts a current through an NMOS transistor 37 to ground potential, and the voltage "U2" that appears across the drain and source terminals of the NMOS transistor is connected to the other input terminal 32b. The control voltage appears on the output terminal 32c of the operational amplifier 32 and is connected, via a conductor 37a, to the gate terminal 37g of the NMOS transistor 37.

FIG. 4 is intended to illustrate a signal receiving unit 40, belonging to an I/O circuit 17, with a signal receiving circuit (not shown) to which the conductors L1, L2 are connectable, each of the conductors having one bond-pad 17a, 17b. Voltage variations, representing a digital information-carrying signal, appear on the conductors, and the conductors are both connected to a terminating load 41, in the form of one NMOS transistor each 42, 43. It should be noticed that in the embodiment illustrated in FIG. 4, the received information-carrying voltage pulses or voltage variations can be of a very low frequency and exhibit good quality reception and signal processing. An increase of the frequency up to the kilohertz (kHz) range does not present any problems with required reception and signal processing.

With a circuit according to the present invention, however, in a practical application, voltage pulses appear on the conductors L1, L2 with a frequency from the megahertz (MHz) range up to the gigahertz (GHz) range, as the invention is applied according to a "differential" or "single-ended" signalling system. If a "single-ended" signalling system is used, one of the conductors, say L2, is connected to a reference voltage or simply just disconnected, and the NMOS transistor 43 can be omitted.

FIG. 4 illustrates the possibility to not only connect the control voltage 30' to the terminating load 41 of the I/O circuit 17 but also to the terminating load 41a of an adjacent I/O circuit, and so on, to further terminating loads, the further terminating loads not shown but indicated. These parallel-connected terminating loads can thus belong to remaining I/O circuits belonging to the shown gate matrix 1.

The generated and adjusted control voltage on conductor 30 also appears on the conductor 30', and the adjusted resistance value of the NMOS transistor 37, in parallel with the reference resistance 35, corresponds to a resistance value of the NMOS transistors 42, 43, which is controlled by the control voltage on conductor 30. The resistance values of the NMOS transistors 42, 43 can thus be regarded as replicas of the adjusted resistance value within the circuit 16. If the resistance values of the NMOS transistors 42, 43, with a generated control voltage and a selected value of the reference resistance 35, do not match the transmission media (conductors L1, L2), then it is possible to achieve such a match by changing the value of the reference resistance 35. The ground potential or zero potential or selected terminating voltage 36 (VT) of the circuit 31 is to be the same as the corresponding potential of the circuit 41.

Figures 5, 6:
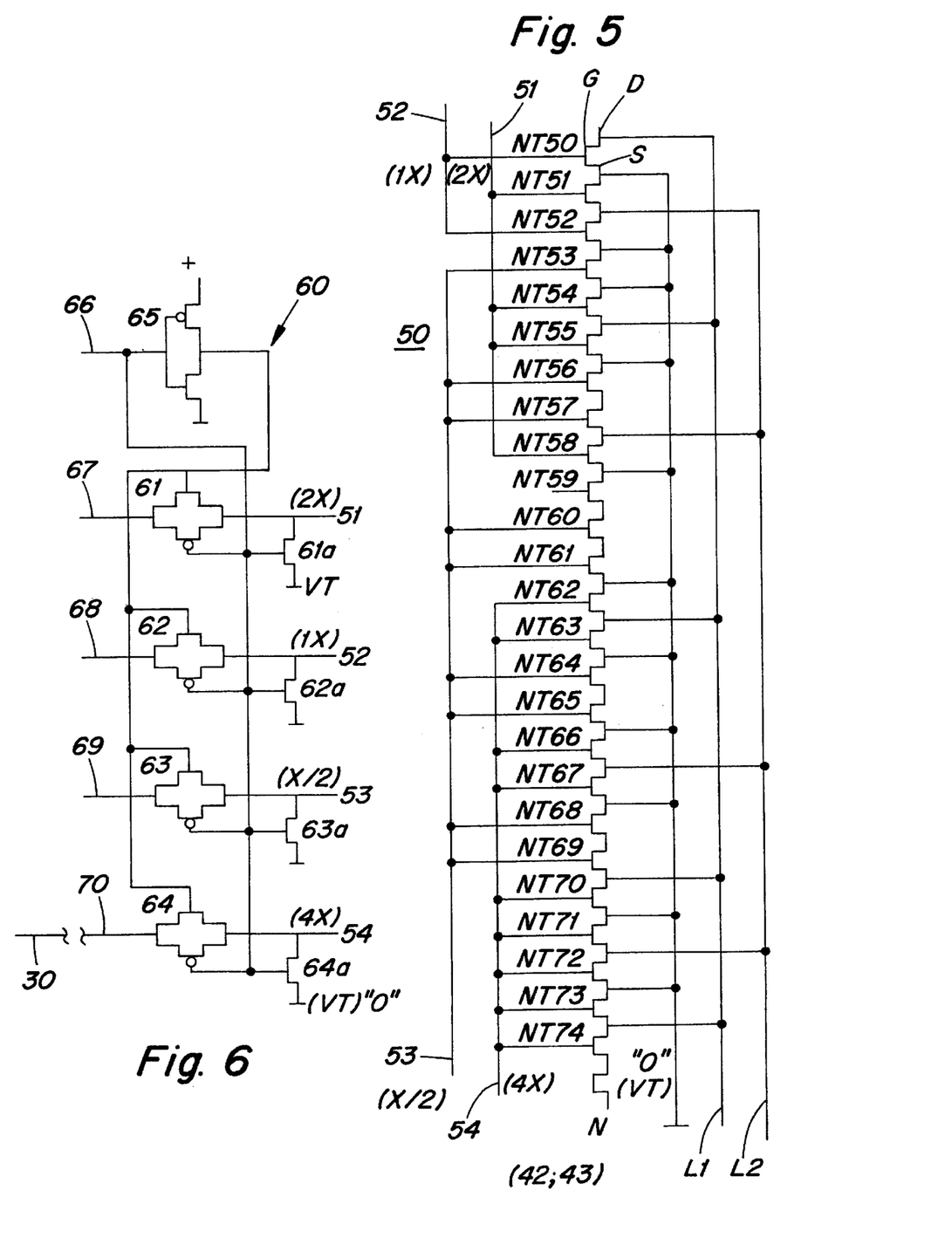
FIG. 5 illustrates a more detailed wiring diagram of a circuit, presenting resistive properties, which is to be able to replace the illustrated permanent terminating load or matching impedance in FIG. 4.
FIG. 6 illustrates an exemplifying embodiment of connecting means intended to transfer one or several analog and digital control signals.

FIG. 5 depicts a circuit presenting resistive properties that a detailed wiring diagram of the circuit shown in FIG. 4. The connecting arrangement according to the present invention can thus, in FIG. 3, replace the shown transistor 37 or, as exemplified in the following description and illustrated in FIG. 4, replace the shown transistor 42 and/or the transistor 43. FIG. 5 depicts a circuit presenting resistive properties that is a detailed wiring diagram of the circuit shown in FIG. 4. The connecting arrangement according to the present invention can also make use of the resistance "R1" according to the illustration in FIG. 4.

The connecting arrangement according to FIG. 5 comprises a number of NMOS transistors, oriented in a row "N", where each and every gate terminal of the transistors points to the left while the drain and source terminals of the transistors point to the right. The latter are, according to the pattern illustrated in FIG. 5, connected to a conductor "0" presenting a voltage reference (VT), normally in the form of a ground reference, a signal conductor "L1", or a signal conductor "L2". The voltage reference (VT) or terminating voltage can, as illustrated, be zero-potential and/or ground potential, but it can also be another, negative or positive, potential. To simplify the following description it is assumed that the reference potential is zero- potential. The NMOS transistors in FIG. 5 have been numbered NT50 to NT74 next to the gate terminal of each respective transistor.

To be operated, the invention uses at least one analog control signal that is connected to one or several control signal lines numbered 51, 52, 53, 54. Every control signal line is connected to the gate terminals of a group of NMOS transistors, and the drain and source terminals of the transistors are connected to the conductors L1, L2, and "0" respectively. The control signal, in the form of a control voltage, and the remaining parameters of the used transistors are selected to be within, or at least close to, the resistive region of the drain-source section of the transistors.

FIG. 5 illustrates thus that a first control signal line 51 coacts with a first group of transistors, where the group NT54, NT55 is connected between the voltage reference conductor "0" and the conductor L1, and the group NT51, NT58 is connected between the conductor "0" and the conductor L2. A second control signal line 52 coacts with a second group of transistors, grouped one by one, and numbered NT50, NT52. A third control signal line 53 coacts with a third group of transistors, which is a series connection of the transistors NT56, NT57; NT60, NT61; NT64, NT65; and NT68, NT69, where the pair-wise transistors NT64, NT65 and NT60, NT61 (and NT53) are deactivated since the drain and source terminals are connected to the conductor "0". A fourth control signal line 54 finally indicated by FIG. 5 coacts with a fourth group of transistors NT62, NT63, NT66, NT67; and N170, NT71, NT72, N173. The transistor NT74 is illustrated as disconnected.

The number of transistors within a first group, such as the group related to the signal line 51, is different from the number of transistors within a second group, such as the group related to the signal line 52. The same applies also to the transistors related to signal line 53 and 54. The embodiment shown in FIG. 5 indicates that the number of NMOS transistors can be chosen to be between ½ and 4 transistors. By ½ transistor is meant a series connection of two transistors, and by 2, 3, or 4 transistors is meant a parallel connection of two, three, or four transistors. It is evident that the number and configuration of the used group-related transistors provide a specific resistance value depending on the selected voltage value of the signal lines 51, 52, 53, 54.

The conductors constitute signalling conductors where digital information in the form of voltage pulses is transferred. To be able to create conditions for a signal receiving circuit to evaluate voltage pulses with a high rate, for instance more than 200 Mb/s, a well-matched impedance is required, depending on the parameter variations of the so called terminating resistances. The circuit, according to the invention and FIGS. 5 and 6, can advantageously be connected as a terminating impedance in a signal receiving unit. The circuit 50 can be used with "single-ended" signalling, with one of the conductors (L1 or L2) connected to a fixed reference voltage or simply disconnected, or with "differential" signalling according to the illustrated wiring diagram in FIG. 5.

The required control signals, appearing as voltage values on signal lines 51, 52, 53, 54, are adjusted with connecting means 60 illustrated in FIG. 6. The connecting means 60 comprises a number of analog transmission gates 61, 62, 63, 64, each made out of one NMOS transistor and one PMOS transistor connected to each other in parallel. Each and every one of these analog transmission gates 61–64 can be activated or deactivated by a signal inverting circuit 65 comprising one NMOS transistor and one PMOS transistor connected to each other in series. A high signal on conductor 66 to the inverting circuit 65 disconnects all the analog transmission gates 61–64, and a low signal on conductor 66 connects the analog transmission gates 61–64. The potential of the signal lines 51–54 is connected to the potential of the "0" conductor through the transistors 61a, 62a, 63a, 64a upon disconnection of the transmission gates An analog transmission gate 61 coacts with a first control signal line 51 related to a first group of transistors; a second analog transmission gate 62 coacts with a second control signal line 52 related to a second group of transistors; and so on. The control voltage belonging to the analog transmission gate 61 and appearing on the conductor 67 can be given a digitized voltage value, which will result in the transistors NT54, NT55; NT51, NT58 presenting a previously determined resistance value. If the control voltage belonging to the analog transmission gate 61 is given analog voltage values, then the transistors NT54, NT55; NT51, NT58 will present a resistance value corresponding to the voltage value on the conductor 67. These conditions apply also to the analog transmission gate 62 with conductor 68, the transmission gate 63 with conductor 69, and the transmission gate 64 with conductor 70.

The exemplified embodiment illustrates that the voltage value appearing on conductor 30 corresponds to a selected terminating reference generated by the circuit 16 illustrated in FIG. 3. It is obvious that digital or analog control voltages can be connected to any of the transmission gates by a core control unit 72, for example, depending on set requirements and provided possibilities. For instance FIG. 6b shows one exemplary embodiment having a switch 77 for connecting conductor 30 to various one of conductors 67–70. The voltage variations on conductor 30 can thus be connected to one or several of the conductors 67–70. It can be advantageous to connect the voltage variations on conductor 30 to one or several of the conductors 67–70 depending on used supply voltage, or other parameters, in order to thereby create a terminating resistance that is adjustable to the present conditions, such as temperature, process parameters, supply voltage, etc.

Figure 6A:
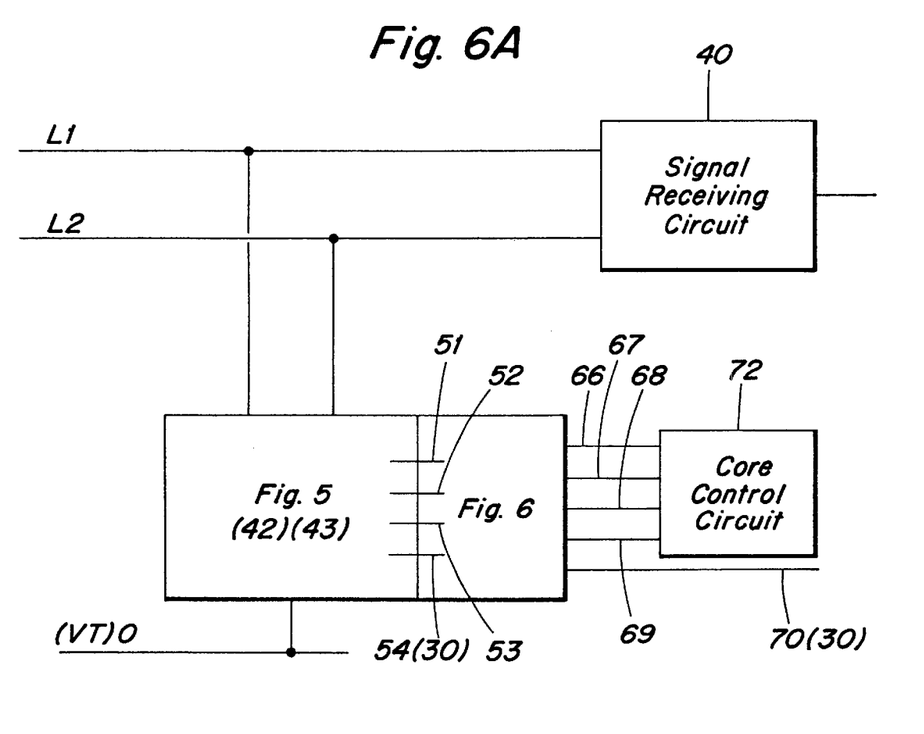

FIG. 6A illustrates the relationship between the components in FIGS. 5 and 6 and the components in FIGS. 3 and 4.

The circuit 50 requires a macro area of its own, preferably immediately adjacent to the macro area of the signal receiving unit or the macro area of the circuit 16. The number of transistors, or the gate-width, can be selected so that the control voltage can be as high as possible, but still within the present supply voltage and output voltage of the amplifier. If the voltage VDS would be so high that the drain-source section of the transistors no longer presents resistive properties, then the transistors would operate as current generators.

Figure 7:
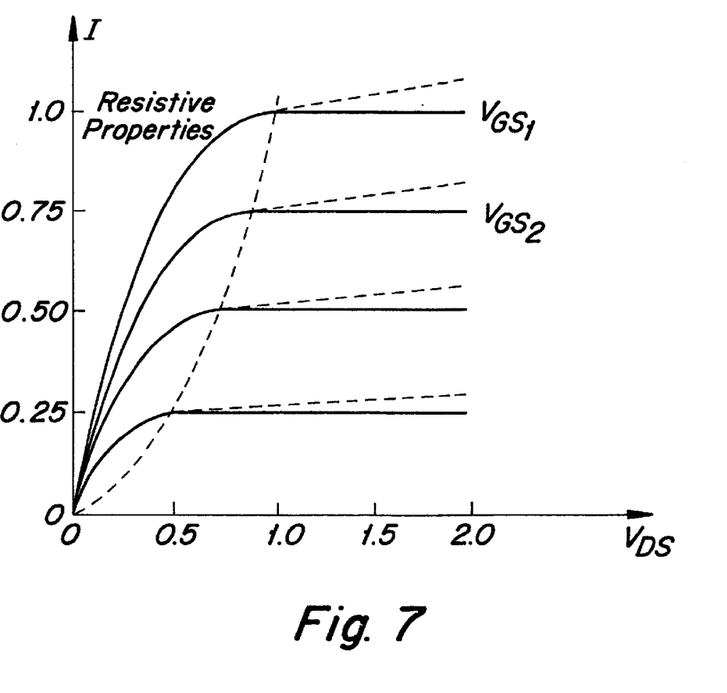
FIG. 7 illustrates characteristic graphs concerning NMOS transistors.

FIG. 7 illustrates characteristics voltage current graphs concerning NMOS transistors. As illustrated in FIG. 7, the transistors exhibit resistive properties when the voltage across the train and source terminals is low within the active region of the transistor.

Figure 8:
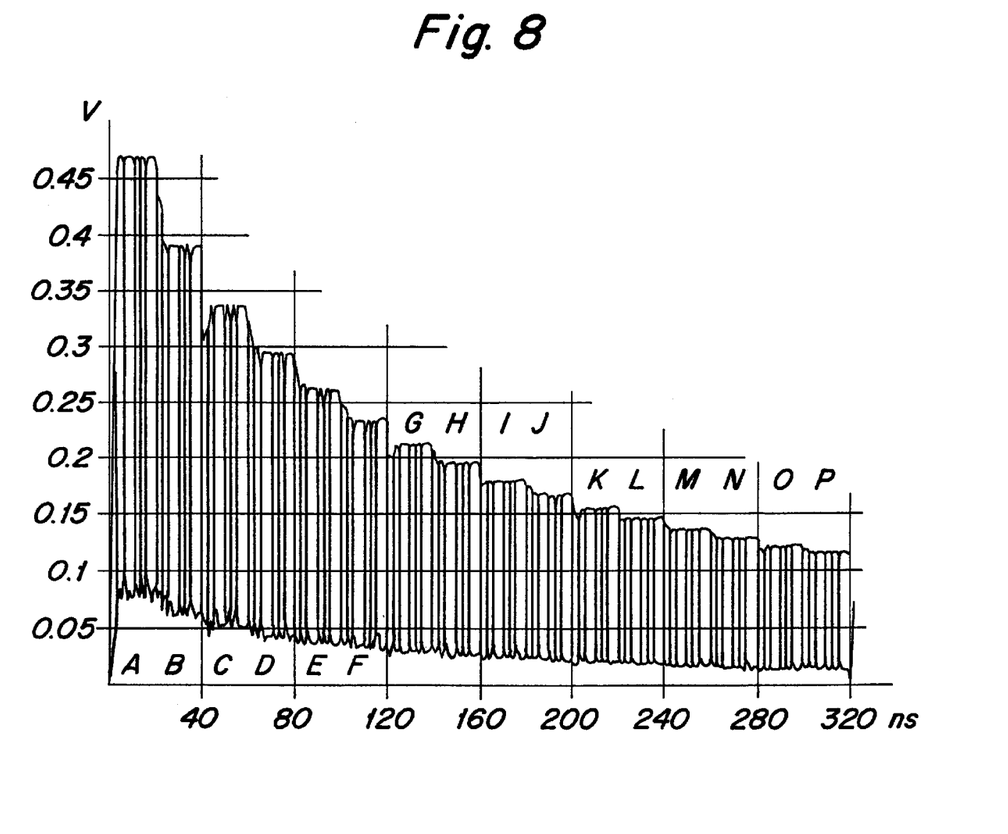
FIG. 8 illustrates the voltage/time diagram at various resistance values acquired through the transistor connections according to FIGS. 5 and 6.

FIG. 8 illustrates a voltage/time diagram at various selected resistance values provided by the transistor connections according to FIG. 5. The following resistance values have been used during the time intervals A–P.

|   | 4x (54) | 2x (51) | x (52) | x/2 (53) | "R" [ohm] |
|---|---------|---------|--------|----------|-----------|
| A | 0 | 0 | 0 | 0 | 0.0 |
| B | 0 | 0 | 0 | 1 | 0.5 |
| C | 0 | 0 | 1 | 0 | 1.0 |
| D | 0 | 0 | 1 | 1 | 1.5 |
| E | 0 | 1 | 0 | 0 | 2.0 |
| F | 0 | 1 | 0 | 1 | 2.5 |

-continued

|   | 4x (54) | 2x (51) | x (52) | x/2 (53) | "R" [ohm] |
|---|---------|---------|--------|----------|-----------|
| G | 0 | 1 | 1 | 0 | 3.0 |
| H | 0 | 1 | 1 | 1 | 3.5 |
| I | 1 | 0 | 0 | 0 | 4.0 |
| J | 1 | 0 | 0 | 1 | 4.5 |
| K | 1 | 0 | 1 | 0 | 5.0 |
| L | 1 | 0 | 1 | 1 | 5.5 |
| M | 1 | 1 | 0 | 0 | 6.0 |
| N | 1 | 1 | 0 | 1 | 6.5 |
| O | 1 | 1 | 1 | 0 | 7.0 |
| P | 1 | 1 | 1 | 1 | 7.5 |

This digital connection sequence, where the digital value "1" is intended to represent one of many available values, illustrates how the number and dimensioning of the transistors within available groups are selected between the groups so that a sequential connection as described above of indicated groups will be able to provide a series of resistance values in steps of 0.5 ohm. This is performed with a resistance variation weighted in a unanimous way according to a digital series.

It is possible to select a resistance value from a continuous resistance variation by selecting and applying an analog control voltage to one or several of the connections 51–54. If a voltage of 0.25 V is desired, this can be achieved by selecting the resistance values of the time interval E or F or, alternatively, selecting an adjusted resistance value between these two.

It is evident that a connecting arrangement according to the invention can be adapted to be used as a terminating impedance related to a signal transmitting unit, or any other device that requires a matching impedance, as well as a signal receiving unit, even though the exemplifying embodiment in this description have described the connecting arrangement related to a signal receiving unit.

It will be understood that the invention is not restricted to the aforesaid and illustrated exemplifying embodiments thereof and that modifications can be made within the scope of the following claims.

What is claimed is:

1. A connecting arrangement presenting resistive properties and values, said connecting arrangement comprising:
   a plurality of transistor combinations connected between two conductors;
   at least one first control signal line, having an analog control voltage, connected to a first group of transistors creating a first transistor combination, wherein said first transistor combination is activated or deactivated in response to said analog control voltage on said first control signal line, and
   at least one second control signal line, having an analog or digital control voltage, connected to a second group of transistors creating at least a second transistor combination, wherein said second transistor combination is activated or deactivated in response to said analog or digital control voltage,
   wherein said analog control voltage and said analog or digital control voltage provides an operating voltage point of each transistor in the first and second transistor combinations approximately within a region where said each transistor in the first and second transistor combination presents resistive properties.

2. The connecting arrangement of claim 1, wherein each transistor in the plurality of transistor combinations is a CMOS transistor having a drain terminal, a source terminal, and a gate terminal, wherein said gate terminal of each transistor in the plurality of transistor combinations is a control terminal that is connected to said first or second control signal lines.

3. The connecting arrangement of claim 1, wherein the control voltage is selected to be as high as possible in the active region of each transistor in the plurality of transistor combinations so that each transistor presents resistive properties.

4. The connecting arrangement of claim 2, wherein a voltage between the drain terminal and the source terminal is low enough in the active region of each transistor in the plurality of transistor combinations so that the drain-source section of each transistor presents resistive properties.

5. The connecting arrangement of claim 1, wherein the number of transistors in the first group is different from the number of transistors in the second group.

6. The connecting arrangement of claim 1, wherein each transistor in said plurality of transistor combinations is NMOS transistors, and at least one of said first and second group of transistors is connected in series between said two conductors to provide said resistive properties.

7. The connecting arrangement of claim 1. wherein the connecting arrangement is connected as a terminating impedance of a signal receiving unit.

8. The connecting arrangement of claim 1, wherein said analog control voltage or said analog or digital control voltage is provided to said first or second control signal lines by connecting means.

9. The connecting arrangement of claim 1, wherein said first and second control signal lines are connected to a respective analog transmission gate.

10. The connecting arrangement of claim 1, wherein a size of each transistor in said plurality of transistor combinations is such that said each transistor presents resistive properties.

11. The connecting arrangement of claim 2, wherein a voltage between a drain terminal and a source terminal of each transistor in said plurality of transistor combinations is less than 1.5 V.

12. A connecting arrangement according to claim 1, wherein said at least one second control signal line comprises a number of control signal lines, each having an associated transistor combination.

13. A connecting arrangement according to claim 12, wherein at least one transistor combination provides a resistance value that differs from resisitance values provided by other transistor combinations.

14. A connecting arrangement presenting resistive properties and values, said connecting arrangement comprising:
   a plurality of transistor combinations connected between two conductors;
   at least one first control signal line, having an analog control voltage, connected to a first group of transistors creating a first transistor combination, wherein said first transistor combination is activated or deactivated in response to an analog control voltage on said first control signal line, and
   at least one second control signal line, having an analog or digital control voltage, connected to a second group of transistors creating at least a second transistor combination, wherein said second transistor combination is activated or deactivated in response to said analog or digital control voltage,
   wherein said analog control voltage and said analog or digital control voltage provides an operating voltage point of each transistor in the first and second transistor combinations approximately within a region where said each transistor in the first and second transistor combination presents resistive properties and wherein one of said conductors carries digital information-carrying voltage pulses.

15. The connecting arrangement of claim 14, wherein another of said conductors is connected to a voltage reference.

16. A connecting arrangement presenting resistive properties and values, said connecting arrangement comprising:
   a plurality of transistor combinations connected in parallel between two conductors;
   at least one first control signal line, having an analog control voltage, connected to a first group of transistors creating a first transistor combination, wherein said first transistor combination is activated or deactivated in response to an analog control voltage on said first control signal line, and
   at least one second control signal line, having an analog or digital control voltage, connected to a second group of transistors creating at least a second transistor combination, wherein said second transistor combination is activated or deactivated in response to said analog or digital control voltage,
   wherein said analog control voltage and said analog or digital control voltage provides an operating voltage point of each transistor in the first and second transistor combinations approximately within a region where said each transistor in the first and second transistor combination presents resistive properties and said control voltage is controlled by connecting means, wherein said connecting means comprises a plurality of analog transmission gates.

17. The connecting arrangement of claim 16, wherein said transmission gates are activated and deactivated by a control circuit.

18. The connecting arrangement of claim 17, wherein said control circuit comprises a signal-inverting circuit.

* * * * *